United States Patent [19]

Sood

[11] Patent Number: 4,724,340

[45] Date of Patent: Feb. 9, 1988

[54] OUTPUT CIRCUIT IN WHICH INDUCED SWITCHING NOISE IS REDUCED BY PRESETTING PAIRS OF OUTPUT LINES TO OPPOSITE LOGIC STATES

[75] Inventor: Lal C. Sood, Austin, Tex.

[73] Assignee: Motorola, Inc., Schaumburg, Ill.

[21] Appl. No.: 933,424

[22] Filed: Nov. 21, 1986

[51] Int. Cl.$^4$ .................... H03K 17/16; H03K 17/20
[52] U.S. Cl. .................... 307/443; 307/451; 307/475; 307/481; 307/242; 307/262; 365/233
[58] Field of Search .............. 307/200 A, 200 B, 443, 307/448, 449, 451, 452-453, 465, 468, 469, 475, 480-481, 353, 236, 242, 572, 573, 575, 576-577, 579, 584, 585, 262, 269; 365/190, 198, 206, 230, 233

[56] References Cited

U.S. PATENT DOCUMENTS

| | | | |
|---|---|---|---|
| 3,976,949 | 8/1976 | Hepworth et al. | 307/448 X |
| 4,495,626 | 1/1985 | Brunin et al. | 307/262 X |
| 4,516,123 | 5/1985 | Shoji | 307/200 B X |
| 4,563,599 | 1/1986 | Donoghue et al. | 307/448 |
| 4,587,445 | 5/1986 | Kanuma | 307/200 A X |
| 4,603,324 | 7/1986 | Hu | 307/236 X |
| 4,609,834 | 9/1986 | Gal | 307/200 A X |
| 4,614,883 | 9/1986 | Sood et al. | 307/449 |
| 4,633,102 | 12/1986 | Childens | 307/262 X |
| 4,656,370 | 4/1987 | Kanuma | 307/200 A X |
| 4,670,714 | 6/1987 | Sievens et al. | 307/262 X |

FOREIGN PATENT DOCUMENTS 0224328  11/1985  Japan .................................. 307/443

Primary Examiner—Stanley D. Miller
Assistant Examiner—D. R. Hudspeth
Attorney, Agent, or Firm—John A. Fisher; Jeffrey Van Myers; James L. Clingan, Jr.

[57] ABSTRACT

An integrated circuit has a plurality of outputs which switch to a valid condition at the same time. Because integrated circuits have leads for power supply terminals, there is inductance on these leads. When an output switches logic states, there is a change in current flow so that there is a voltage drop across the inductive lead which is used for power supply coupling. This voltage drop, expressed Ldi/dt, is proportional to the number of outputs which are switched. The worst case for the positive power supply terminal Ldi/dt is when all of the outputs switch from a logic low to a logic high. This worst case is reduced in half by predisposing half of the outputs to one logic state and the other half to the other logic state. This also reduces the worst case for the negative power supply terminal, frequently ground, in half which is the case when all of the outputs switch from a logic high to a logic low.

17 Claims, 2 Drawing Figures

4,724,340

OUTPUT CIRCUIT IN WHICH INDUCED SWITCHING NOISE IS REDUCED BY PRESETTING PAIRS OF OUTPUT LINES TO OPPOSITE LOGIC STATES

FIELD OF THE INVENTION

The present invention relates to integrated circuit output circuits, and more particularly, to integrated circuit output circuits which provide an output comprised of a plurality of signals.

BACKGROUND OF THE INVENTION

In integrated circuits, there is generally a piece of silicon known as a die or chip which contains electrical circuits and which is connected to a lead frame. The chip has bonding pads which are connected to the lead frame by tiny wires. The lead frame has leads which are used for connecting to a printed circuit board as part of a larger system. The leads of the lead frame have a certain amount of inductance as well as capacitance and resistance. There is also some inductance in the wire from the bonding pad to the lead frame. This wire inductance, however, is significantly less than that of the lead frame. The connection of a lead of the lead frame to a circuit board also adds some inductance. As the switching speeds of integrated circuits have increased, this cumulative inductance has begun to have an impact on the performance of the integrated circuit.

Of course it is desirable to have integrated circuits which are very fast. The increased switching speed has also increased the rate at which current changes. This increased rate of current change causes a voltage drop across the inductance. The voltage across an inductance is equal to the inductance times the time rate of change of the current through that inductance. This is expressed as Ldi/dt, where L is the inductance and di/dt is the time rate of change of the current. As the di/dt becomes larger, the voltage across the inductance becomes larger. This voltage drop across an inductance causes a voltage differential between the lead location on the circuit board and the bonding pad to which it is connected on the integrated circuit. This can create a problem of having the internal supply at different voltage than the voltage of the external supply.

The problem is compounded when the output that is being provided is made up of a plurality of signals. Many integrated circuits have an output comprised of a plurality of signals. There are memory circuits which provide 4 bit or 8 bit outputs. When four bits comprise a single output, the output is generally referred to as a nibble. When eight bits comprise the output, the output is generally referred to as a byte. In integrated circuit microprocessors, there are commonly 8 and 16 bit outputs and even 32 bit outputs. Such multiple signal outputs multiply the problem of current change. The most severe problem is when all of the bits change from a logic high to a logic low or from a logic low to a logic high. For the logic low to logic high situation there is a maximum change in current flowing from the positive power supply to the outputs of the various buffers which comprise the output circuit. This then is the case for maximum voltage drop from the positive external power supply to the positive internal power supply. For the logic high to logic low transition there is a maximum change in current flowing from the negative power supply to the internal negative power supply. The negative power supply is often ground in current state of the art integrated circuits. This then is the situation in which the voltage of the internal ground is the highest voltage with respect to the external or system ground. Of course the integrated circuit must be designed to handle the most severe problem. The desired output is also of course not known so the integrated circuit must be designed to handle the case in which all of the signals which comprise the output will change.

If the Ldi/dt voltage drop, caused by the large current change, between the internal and external voltage terminals becomes sufficiently large, the logic state of other inputs to integrated circuit 10 can be misinterpreted. What the external circuit board interprets as a logic low may be interpreted as a logic high by the integrated circuit because the internal power supply voltage is so low. Although this differential between internal and external power supply voltage is only for the duration of the high rate of change of current, this can result in providing an erroneous output in an integrated circuit that is externally clocked or a significant delay in providing a valid output in an integrated circuit that is static.

The same type of situation can occur for the case in which the output buffers begins sinking current. This will have the affect of raising the voltage of the internal ground above that of the circuit board ground. If this voltage differential becomes sufficiently large, then inputs to the integrated circuit may be misinterpreted. A signal which is a logic high with respect to the circuit board which is using the internal ground as the ground reference, may be interpreted by the integrated circuit as a logic low because the internal ground terminal is at too high of a voltage. This is particularly true of TTL input levels which are skewed to the ground side of the power supply.

One conventional solution has been to keep the device sizes of the output buffer sufficiently low so that the output buffer does not cause too large of a current change. This of course is a sacrifice of speed. Another solution has been to add more power supply leads so that the current change is spread over more leads. More leads can viewed as placing inductors in parallel which decreases the inductance. This adds to the cost of the package as well as requiring more space on the circuit board.

SUMMARY OF THE INVENTION

An object of the present invention is to provide an improved output circuit for an integrated circuit.

Another object of the invention is to provide an output circuit with an improved di/dt characteristic.

Yet another object of the invention is to provide an improved output circuit for providing a plurality of signals.

These and other objects are achieved in an integrated circuit having a first output terminal, a second output terminal, a first buffer circuit, a second buffer circuit, and a predisposition circuit. The first buffer circuit provides a first output signal on the first output terminal at one of the two possible logic states in response to a control signal. This logic state provided by the first buffer circuit is indicative of a first input signal. The second buffer circuit provides a second output signal on the second output terminal at one of the two possible logic states in response to the control signal. This logic state provided by the second buffer circuit is indicative of a second input signal. The predisposition circuit is coupled to the first and second outputs. The predisposition circuit causes the first and second outputs to be at different logic states at least immediately prior to the first and second buffer means providing the first and second output signals on the first and second output terminals.

DESCRIPTION OF THE INVENTION

Figure 1:
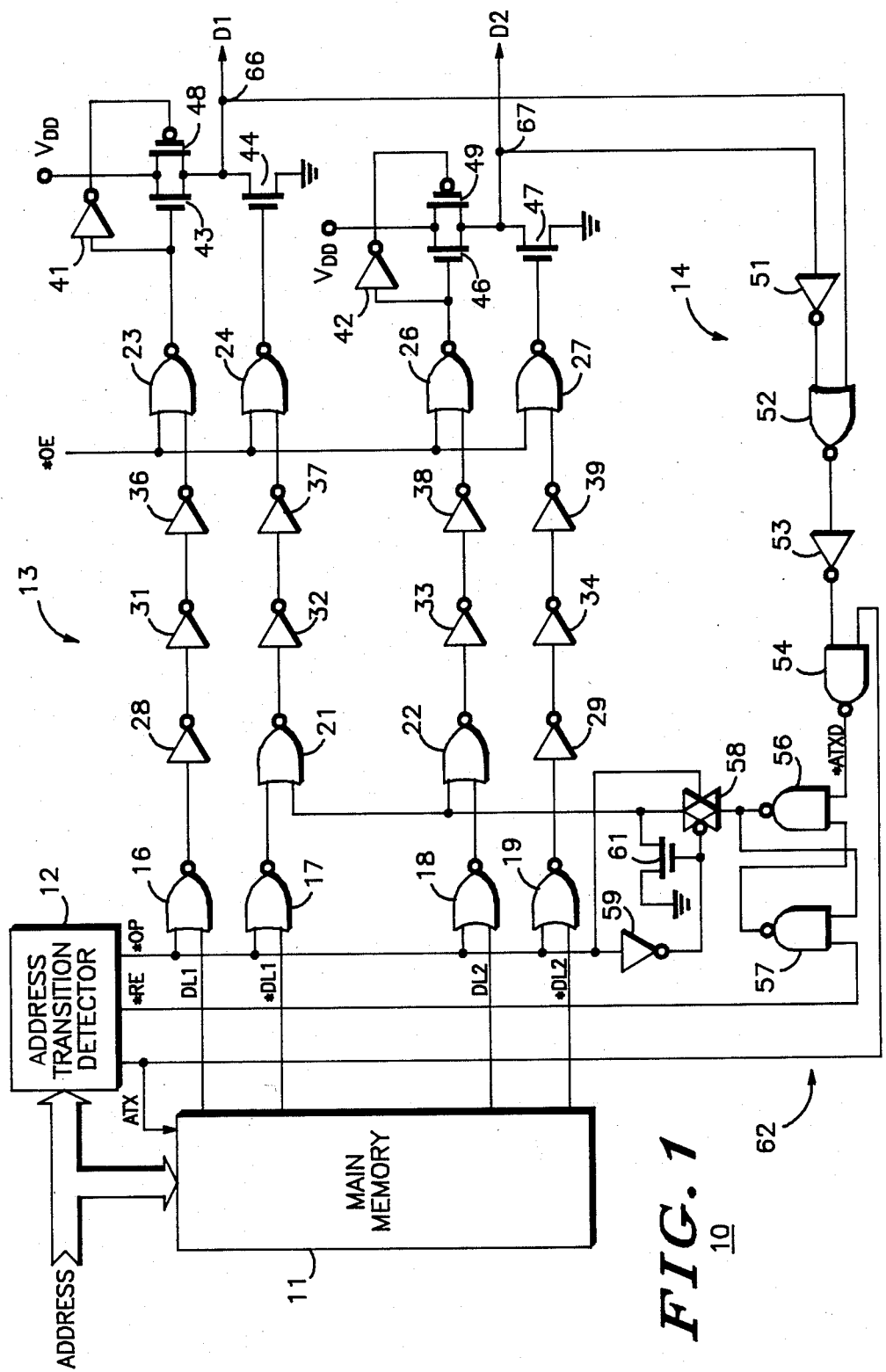
FIG. 1 is a combination circuit diagram and block diagram of a memory according to a preferred embodiment of the invention.

Shown in FIG. 1 is an integrated circuit memory 10 comprised generally of a main memory 11, an address transition detector 12, an output buffer 13, and a control circuit 14. Memory 10 provides for a one half reduction in the worst case Ldi/dt voltage drop by predisposing the outputs to opposite logic states. Consequently, the worst case of having all of the output signals switch from the same logic state to the opposite logic state is avoided. Output buffer 13 comprises a NOR gate 16, a NOR gate 17, a NOR gate 18, a NOR gate 19, a NOR gate 21, a NOR gate 22, a NOR gate 23, a NOR gate 24, a NOR gate 26, a NOR gate 27, an inverter 28, an inverter 29, an inverter 31, an inverter 32, an inverter 33, an inverter 34, an inverter 36, an inverter 37, an inverter 38, an inverter 39, an inverter 41, an inverter 42, an N channel transistor 43, an N channel transistor 44, an N channel transistor 46, an N channel transistor 47, a P channel transistor 48, and a P channel transistor 49. Control circuit 14 comprises an inverter 51, a NOR gate 52, an inverter 53, a NAND gate 54, a NAND gate 56, a NAND gate 57, a transmission gate 58, an inverter 59, and an N channel transistor 61.

Figure 2:
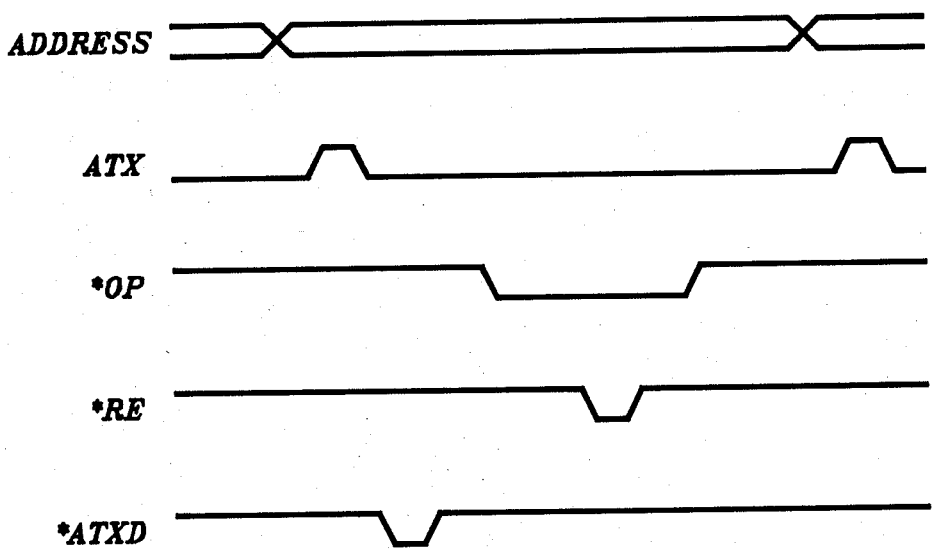
FIG. 2 is a timing diagram of signals useful in the operation of the memory of FIG. 1.

Main memory 11 contains bits of information which are selected in response to an address. Each selected bit of information is represented by a pair of complementary signals. In memory 10 two bits of information are selected in response to a single address. One of the selected bits of information is represented by a pair of signals DL1 and *DL1, wherein signal DL1 is the true signal and signal *DL1 is the complement thereof. The asterisk (*) is used to indicate that the particular signal is a complement. The other of the selected bits is represented by signals DL2 and *DL2. Address transition detector 12 generates, in response to an address transition, an address transition pulse ATX, a reset pulse *RE, and an output precharge pulse *OP. Pulse ATX switches to a logic high in response to an address change then switches to a logic low a relatively short time, such as 5 nanoseconds (ns), later. Pulse *OP is at logic high until a predetermined time delay after signal ATX switches to a logic high at which time pulse *OP switches to a logic low. Signal *OP remains at a logic low for the time duration that output signals are specified as being valid. Pulse *RE pulses to a logic low after pulse *OP switches to a logic low but is of less duration than signal *OP so that pulse *RE switches back to a logic high before pulse *OP switches back to a logic high. This timing relationship is shown in FIG. 2.

Buffer 13 has four inputs for receiving data signals DL1, *DL1, DL2, and *DL2, and two outputs for providing data output signals D1 and D2. Control circuit 14 has a first input for receiving output signal D1, a second input, for receiving signal D2, and an output.

A description of how the elements of buffer 13 are connected follows. NOR gates 16–19 each have a first input for receiving pulse *OP. NOR gates 16–19 each have second inputs. The second inputs of NOR gates 16–19 receive signals DL1, *DL1, DL2, and *DL2, respectively. NOR gates 16–19 each have an output. Inverter 28 has an input connected to the output of NOR gate 16, and an output. NOR gate 21 has a first input connected to the output of NOR gate 17, a second input connected to the output of control circuit 14, and an output. NOR gate 22 has a first input connected to the output of NOR gate 18, a second input connected to the output of control circuit 14, and an output. Inverter 29 has an input connected to the output of NOR gate 19, and an output. Inverter 31 has an input connected to the output of inverter 28, and an output. Inverter 32 has an input connected to the output of NOR gate 21, and an output. Inverter 33 has an input connected to the output of NOR gate 22, and an output. Inverter 34 has an input connected to the output of inverter 29, and an output. Inverter 36 has an input connected to the output of inverter 31, and an output. Inverter 37 has an input connected to the output of inverter 32, and an output. Inverter 38 has an input connected to the output of inverter 33, and an output. Inverter 39 has an input connected to the output of inverter 34, and an output. NOR gates 23, 24, 26, and 27 each have a first input for receiving an output enable signal *OE. Signal *OE is derived from a signal which is received externally from integrated circuit memory 10. NOR gates 23, 24, 26, and 27 each have a second input and an output. The second inputs of NOR gates 23, 24, 26, and 27 are connected to the outputs of inverters 36-39, respectively. Transistor 43 has a gate connected to the output of NOR gate 23, a drain connected to a positive power supply terminal VDD for receiving a positive power supply voltage of, for example 5 volts, and a source for providing output signal D1 on an output terminal 66. Transistor 44 has a gate connected to the output of NOR gate 24, a source connected to ground, and a drain connected to the source of transistor 43. Transistor 46 has a gate connected to the output of NOR gate 26, a drain connected to VDD, and a source for providing output signal D2 on an output terminal 67. Transistor 47 has a gate connected to the output of NOR gate 27, a source connected to ground, and a drain connected to output terminal 67. Transistor 48 has a source connected to VDD, a drain connected to the source of transistor 43, and a gate. Transistor 49 has a source connected to VDD, a drain connected to the source of transistor 46, and a gate. Inverter 41 has an input connected to the output of NOR gate 23, and an output connected to the gate of transistor 48. Inverter 42 has has an input connected to the output of NOR gate 26, and an output connected to the gate of transistor 49.

A description of how the elements of control circuit 14 are connected follows. Inverter 51 has an input for receiving signal D2, and an output. NOR gate 52 has a first input for receiving signal D1, a second input connected to the output of inverter 51, and an output. Inverter 53 has an input connected to the output of NOR gate 52, and an output. NAND gate 54 has a first input connected to the output of inverter 53, a second input for receiving signal ATX, and an output. NAND gate 56 has a first input connected to the output of NAND gate 54, a second input, and an output. NAND gate 57 has a first input connected to the output of NAND gate 56, a second input for receiving pulse *RE, and an output connected to the second input of NAND gate 56. Transmission gate 58 has a signal input connected to the output of NAND gate 56, a true control input for receiving pulse *OP, a complementary control input, and a signal output. Inverter 59 has an input for receiving pulse *OP, and an output connected to the complementary control input of transmission gate 58. Transistor 61 has a gate connected to the output of inverter 59, a drain connected to the signal output of transmission gate 58, and a source connected to ground.

Ouput signals D1 and D2 are outputs of integrated circuit memory 10 indicative of the bits at the addressed locations in main memory 11. When one of signals D1 and D2 change logic state from a logic high to a logic low, there is a change in current flow from VDD. On the other hand when one of signals D1 and D2 change from a logic high to a logic low, there is a change in current flow to ground. The change in current flow from a power supply terminal inside an integrated circuit causes a drop in voltage due to inductance between the internal power supply terminal and the source of the power supply voltage which is external to the integrated circuit. This is the Ldi/dt affect which is advantageous to minimize. The Ldi/dt is the least when neither signal D1 nor D2 change logic state. The maximum Ldi/dt affecting a particular power supply voltage occurs when both signals change from the same state. The largest change in current flow from VDD occurs when both signals D1 and D2 change from a logic low to a logic high. The largest change in current flow to ground occurs when both signals D1 and D2 change from a logic high to a logic low. Although the total di/dt may be essentially the same if signals D1 and D2 both change from opposite logic states, the affect on a particular power supply voltage is half that of both signals D1 and D2 changing from the same state. Integrated circuit memory 10 avoids the worst case Ldi/dt situation by ensuring that signals D1 and D2 are at opposite logic states prior to switching to a valid logic state.

Signal *OE is at a logic low when memory 10 is to provide an output. When signal *OE is a logic high, each of NOR gates 23, 24, 26, and 27 are forced to provide a logic low output. The logic low outputs of NOR gates 23, 24, 26, and 27 force transistors 43, 44, 46, and 47 to be non-conductive, and inverters 41 and 42 to provide logic high outputs which causes transistors 48 and 49 to be non-conductive. With transistors 43, 44, and 46-49 non-conductive, the two outputs of memory 10, signals D1 and D2, are high impedance which is commonly known as tristated. Signal *OE, at a logic high thus forces buffer 13 to a tri-state condition.

Prior to an address transition, pulse ATX is a logic low, pulse *OP is a logic high, and pulse *RE is a logic high. With pulse *OP at a logic high, the outputs of NOR gates 16-19 are all at a logic low. Pulse *RE at a logic high allows a latch 62 comprised of NAND gates 56 and 57 to be responsive to the output of NAND gate 54. The output of NAND gate 54 is a logic high because signal ATX is a logic low. Also at a time prior to the address transition, pulse *RE has pulsed to a logic low to reset latch 62 to a logic low output condition, but pulse *RE is at a steady state logic high. Transmission gate 58 has its signal input coupled to its output because pulse *0P is a logic high. The signal input of transmission gate 58 is connected to the output of latch 62 which is the output of NAND gate 56 which is at a logic low. The logic low output of latch 62 is thus the output of control circuit 14. NOR gates 21 and 22 thus each have one input at logic low provided by the output of control circuit 14. NOR gates 21 and 22 are thus responsive to the outputs of NOR gates 17 and 18, respectively. While pulse *OP is a logic high both NOR gates 17 and 18 provide a logic low output so that the outputs of NOR gates 21 and 22 are a logic high. With NOR gates 16 and 19 also providing a logic low output, inverters 28 and 29 provide logic high outputs. With inverters 31-34 each receiving a logic high input, inverters 31-34 each provide a logic low output. The logic low outputs of inverters 31-34 cause each of inverters 36-39 to provide a logic high output. When signal *OE is a logic low, NOR gates 23, 24, 26, and 27 are responsive to the outputs of inverters 36-39, respectively. Accordingly, NOR gates 23, 24, 26, and 27 provide logic low outputs. As for the case in which signal *OE is a logic low, when the outputs of NOR gates 23, 24, 26, and 27 are at a logic low, transistors 43, 44, and 46-49 are non-conductive.

In response to an address transition, pulse ATX pulses to a logic high. A typical use of a pulse such as pulse ATX is to precharge bit lines in main memory 10. Pulse ATX is also received by NAND gate 54 so that while pulse ATX is a logic high, NAND gate 54 is responsive to inverter 53. Pulse *OP also is responsive to the address transition which indicates that a new address is to select the location in main memory 11 which is to provide data. When pulse *OP switches to a logic low, signals DL1, *DL1, DL2, and *DL2 represent valid data. Pulse *OP at a logic low results in NOR gates 16-19 being responsive to signals DL1, *DL1, DL2, and *DL2. In response to pulse *OP being a logic low, buffer 13 provides signal D1 at a logic state determined by signals DL1 and *DL1 and provides signal D2 at a logic state determined by signal DL2 and *DL2. When signal *OP switches back to a logic high, NOR gates 16-19 are all forced to output a logic low. Buffer 13 is then no longer responsive to signals DL1, *DL1, DL2, and *DL2.

Inverter 51, NOR gate 52, and inverter 53 detect the logic states of signals D1 and D2. The output of inverter 53 will be a logic high except for the case in which signal D1 is a logic low and signal D2 is a logic high. When the output of inverter 53 is a logic low, NAND gate 54 is forced to output a logic high. NAND gate 54 is also forced to provide a logic high output when pulse ATX is a logic low. When pulse ATX switches to a logic high, NAND gate 54 responds to the output of inverter 53. Prior to pulse ATX switching to a logic high, latch 62 has been reset by reset pulse *RE so that the output of latch 62 is a logic low. If the output of inverter 53 is a logic high when pulse ATX switches to a logic high, NAND gate will output a logic low pulse *ATXD, shown in FIG. 2, for the same duration as pulse ATX is a logic high. The logic low output of NAND gate 54 will set latch 62 to provide a logic high output which is coupled to NOR gates 21 and 22 via transmission gate 58. When NOR gates 21 and 22 receive a logic high input the outputs thereof are forced to a logic low. The logic low output of NOR gate 21 is inverted three times by inverter 32, inverter 37, and NOR gate 24 so that transistor 44 receives a logic high which makes transistor 44 conductive. The logic low output of NOR gate 22 is inverted three times by inverter 33, inverter 38, and NOR gate 26 so that transistor 46 and inverter 42 receive a logic high which causes transistors 46 and 49 to be conductive. Signal D1 is thus forced to a logic low, and signal D2 is forced to a logic high as a consequence of the output of control circuit 14 switching to a logic high. The switching of the output of control circuit 14 to a logic high is timed by pulse ATX but is inhibited when signal D1 is a logic high and signal D2 is a logic low. Thus when signals D1 and D2 are the same logic state, signal D1 is forced to a logic low, and signal D2 is forced to a logic high. If signal D1 is already a logic low and signal D2 is already a logic high, the output of control circuit 14 also switches to a logic high but the affect is simply to retain the logic states of signals D1 and D2.

For the case in which signal D1 is a logic high and signal D2 is a logic low, the output of control circuit 14 remains at a logic low upon the occurrence of pulse ATX. There is no need to change output signals D1 and D2 because they are already different. Control circuit 14 thus causes signals D1 and D2 to be different logic states prior to becoming valid. Buffer circuit 13 is used by control circuit 14 to ensure this logic state difference of signals D1 and D2 prior to becoming valid. The output of control circuit 14 causes this logic state difference on output terminals 66 and 67 via buffer 13. The output of control circuit 14 is coupled to output terminal 66 via NOR gate 21, inverter 32, inverter 37, NOR gate 24, and transistor 44. The output of control circuit 14 is coupled to output terminal 67 via NOR gate 22, inverter 33, inverter 38, NOR gate 26, and transistor 46.

Thus prior to pulse *OP switching to a logic low, signals D1 and D2 are ensured of being in opposite logic states. When pulse *OP switches to a logic low, buffer 13 responds to signals DL1, *DL1, DL2, and *DL2. Regardless of which states are indicated for signals D1 and D2, no more than one of them can switch to a logic high. Switching to a logic high causes the Ldi/dt voltage drop cuased by the inductance of leads of integrated circuits such as memory integrated circuit 10. The Ldi/dt voltage drop with repect to VDD is thus limited to only one of signals D1 and D2 because one of them is already at a logic high when pulse *OP switches to a logic low. Similarly, the Ldi/dt voltage drop with respect to a ground terminal is limited to only one of signals D1 and D2 because one of signals D1 and D2 is already a logic low.

Memory 10 thus cuts the worst case Ldi/dt voltage drop in half by predisposing signals D1 and D2 to opposite logic states prior to providing valid data. This approach can be extended to any number of outputs. Memories are often available with four or eight bit outputs. In such a case, a control circuit such as control circuit 14 could be provided for other output pairs. This approach is also applicable to other circuit types which have multiple data outputs such as microprocessors. Microprocessors generally have multiple outputs, for example, data buses and address buses, which switch simultaneously. There are commercially available microprocessors which have as many as 32 bit outputs. The approach of memory 10 could be applied to such a microprocessor by predisposing 16 of the 32 to bits to a logic low and the other 16 bits to a logic high prior to providing a valid output to reduce the Ldi/dt voltage drop by one half. Additionally, the approach of memory 10 could be used in conjunction with other circuit techniques in reducing peak Ldi/dt. The output signal may be optimally shaped for minimum peak Ldi/dt while still further obtaining the one half reduction in Ldi/dt by predisposing half of the output signals to one logic state and the other half to the other logic state.

I claim:

1. In an integrated circuit having a first output terminal and a second output terminal, a circuit comprising:
    first buffer means for providing a first output signal on the first output terminal at one of two possible logic states in response to a control signal, said logic state provided being indicative of a first input signal;
    second buffer means for providing a second output signal on the second output terminal at one of the two possible logic states in response to the control signal, said logic state provided being indicative of a second input signal; and
    predisposition means, coupled to the first and second outputs, for causing the first and second outputs to be at different logic states at least immediately prior to the first and second buffer means providing the first and second output signals on the first and second output terminals.

2. The integrated circuit of claim 1, wherein the predisposition means is further characterized as detecting the logic states of the first and second output terminals and changing the logic state on the first output terminal if both the first and second output terminals are detected as being at a first logic state, changing the logic state on the second output terminal if both the first and second output terminals are detected as being at a second logic state, and not changing the logic state on either the first or second output terminal if the logic states of the first and second output terminals are detected as being different.

3. The integrated circuit of claim 2 further characterized as being a memory which provides data in response to an address further comprising:
    address detection means for providing the control signal in response to an address transition.

4. The integrated circuit of claim 3 wherein:
    the address detection means is further characterized as providing a predisposition signal to the predisposition means prior to providing the control signal; and
    the predisposition means is further characterized as causing the first and second output terminals to be at different logic states in response to receiving the predisposition signal.

5. The integrated circuit of claim 4 wherein the predisposition means is further characterized as providing a set signal for causing the first and second output terminals to be at different logic states.

6. The integrated circuit of claim 5 wherein the predisposition means is further characterized as providing the set signal in response to the predisposition signal when both the first and second output terminals are detected as being at a first logic state or when both the first and second output terminals are detected as being at a second logic state.

7. The integrated circuit of claim 6 wherein:
    the first buffer means is further characterized as providing coupling between the first output terminal and the set signal; and
    the second buffer means is further characterized as providing coupling between the second output terminal and the set signal.

8. The integrated circuit of claim 7 wherein:
    the first buffer is further characterized as providing the second logic state on the first output terminal in response to the set signal; and the second buffer is further characterized as providing the first logic state on the second output terminal in response to the set signal.

9. The integrated circuit of claim 1 wherein:
the first buffer means is further characterized as providing coupling between the first output terminal and the prediposition means; and
the second buffer means is further characterized as providing coupling between the second output terminal and the predisposition means.

10. The integrated circuit of claim 1 further characterized as being a memory which provides data in response to an address, further comprising:
address detection means for providing the control signal in response to an address transition.

11. The integrated circuit of claim 10 wherein:
the address detection means is further characterized as providing a predisposition signal to the predisposition means prior to providing the control signal; and
the predisposition means is further characterized as causing the first and second output terminals to be at different logic states in response to receiving the predisposition signal.

12. The integrated circuit of claim 1 wherein the predisposition means is further characterized as providing a set signal for causing the first and second output terminals to be at different logic states.

13. The integrated circuit of claim 12 wherein the predisposition means is further characterized as providing the set signal in response to the predisposition signal when both the first and second output terminals are detected as being at a first logic state or when both the first and second output terminals are detected as being at a second logic state.

14. In an integrated circuit having a first output terminal and a second output terminal, a method comprising the steps of:
providing a first output signal on the first output terminal at one of two possible logic states in response to a control signal, said logic state provided being indicative of a first input signal;
providing a second output signal on the second output terminal at one of the two possible logic states in response to the control signal, said logic state provided being indicative of a second input signal; and
causing the first and second outputs to be at different logic states at least immediately prior to the first and second buffer means providing the first and second output signals on the first and second outputs.

15. The method of claim 14 further comprising the step of:
detecting the logic states of the first and second output terminals prior to the occurrence of the control signal.

16. The method of claim 15 further comprising the step of forcing the first output terminal to a different logic state if both of the first and second output terminals are detected as being at a first logic state.

17. The method of claim 16 further comprising the step of forcing the second output terminal to a different logic state if both of the first and second output terminals are detected as being at a second logic state.

* * * * *